(12) United States Patent
Huang

(10) Patent No.: US 6,579,784 B1
(45) Date of Patent: Jun. 17, 2003

(54) METHOD FOR FORMING A METAL GATE INTEGRATED WITH A SOURCE AND DRAIN SALICIDE PROCESS WITH OXYNITRIDE SPACERS

(75) Inventor: Jenn Ming Huang, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/419,511

(22) Filed: Oct. 18, 1999

(51) Int. Cl.$^7$ ................. H01L 21/336; H01L 21/425; H01L 21/3205; H01L 21/4763; H01L 21/302

(52) U.S. Cl. ................. 438/595; 438/301; 438/529; 438/652; 438/656

(58) Field of Search ................. 438/301, 529, 438/595, 652, 655, 656

(56) References Cited

U.S. PATENT DOCUMENTS

| | | | |
|---|---|---|---|
| 4,745,082 A | 5/1988 | Kwok | 437/39 |
| 4,908,332 A | 3/1990 | Wu | 437/192 |
| 5,395,799 A | 3/1995 | Yu | 437/200 |
| 5,447,874 A | 9/1995 | Grivna et al. | 437/40 |
| 5,670,401 A | 9/1997 | Tseng | 437/44 |
| 5,731,239 A | 3/1998 | Wong et al. | 438/296 |
| 5,856,225 A * | 1/1999 | Lee et al. | 438/291 |
| 5,966,597 A * | 10/1999 | Wright | 438/592 |
| 6,033,963 A * | 3/2000 | Huang et al. | 438/303 |
| 6,054,355 A * | 4/2000 | Inumiya et al. | 438/296 |
| 6,093,628 A * | 7/2000 | Lim et al. | 438/592 |
| 6,118,161 A * | 9/2000 | Chapman et al. | 257/401 |
| 6,137,137 A * | 10/2000 | Wu | |
| 6,228,722 B1 * | 5/2001 | Lu | 438/279 |

* cited by examiner

Primary Examiner—John F. Niebling
Assistant Examiner—Ron Pompey
(74) Attorney, Agent, or Firm—George O. Saile; Stephen B. Ackerman (57) ABSTRACT

A method of forming a metal gate integrated with a salicide process on the source and drain regions. A gate dielectric layer and polysilicon/silicon dioxide/silicon nitride dummy gate layers are formed over a substrate structure and patterned to form dummy structures, comprising at least one dummy gate structure. Lightly doped source and drain regions, sidewall spacers, and source and drain regions are formed adjacent to the dummy gate structure. A silicide layer is formed on the source and drain regions by depositing titanium/titanium nitride, performing a rapid thermal anneal, selectively removing unreacted titanium/titanium nitride using $NH_4OH$, and performing a second rapid thermal anneal. A blanket dielectric layer is formed over the dummy structures. The blanket dielectric layer, the spacers and the silicon nitride layer of the dummy structures are planarized using a chemical mechanical polishing process. The silicon nitride layer and the silicon dioxide layer of the dummy structures are removed. A titanium nitride layer is formed over the polysilicon layer of the dummy structures, and a tungsten layer is deposited over the titanium nitride layer. The tungsten layer and titanium nitride layer are planarized using a chemical mechanical polishing process, thereby forming polysilicon/titanium nitride/tungsten structures.

15 Claims, 6 Drawing Sheets

METHOD FOR FORMING A METAL GATE INTEGRATED WITH A SOURCE AND DRAIN SALICIDE PROCESS WITH OXYNITRIDE SPACERS

BACKGROUND OF INVENTION

1) Field of the Invention

This invention relates generally to fabrication of a semiconductor device and more particularly to a method for forming a metal gate device which can be integrated with a salicide process on the source and drain regions.

2) Description of the Prior Art

Polysilicon gate electrodes are commonly used in CMOS devices. However, as device densities continue to increase beyond the 0.2 $\mu$m generation, polysilicon gates are adversely affected by poly depletion which can reduce performance by more than 15%. While metal gates are an attractive alternative, they are susceptible to metal migration during subsequent operations that are performed at elevated temperatures.

Another problem with existing metal gate processes is that the fluorine etch typically used to pattern the metal layer to define a gate electrode has poor selectivity for silicon dioxide. This poor selectivity causes poor gate oxide definition resulting in damage to the underlying silicon.

To avoid the fluorine etch of the metal layer, a replacement gate process can be used. In a replacement gate process, a dummy gate is formed of silicon dioxide or a polymer such as photoresist. An oxide layer is formed over the dummy gate. The oxide layer is planarized and the dummy gate is removed leaving a gate opening. Then, the desired gate material is deposited into the gate opening. One problem with existing replacement gate processes is that they are not easily integrated with a salicide process on the source and drain regions.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,731,239 (Wong et al.) shows a method of forming a poly/TiSi$_x$ gate with a separate salicide step to form TiSi$_x$ on the source and drain regions.

U.S. Pat. No. 4,908,332 (Wu) shows a process for forming a poly/metal gate. This process does not show or suggest the use the poly/SiO$_2$/Si$_3$N$_4$ substitutional gate or the poly/TiN/W gate electrode of the present invention. This process also does not show or suggest the integration of a salicide step on the source and drain regions.

U.S. Pat. No. 5,447,874 (Grivna et al.) shows a method for forming a two layer metal gate using a damascene/CMP process. This method does not provide the poly/TiN/W gate of the invention, and is not easily integrated with a salicide process on the source and drain.

U.S. Pat. No. 4,745,082 (Kwok) shows a substitutional gate method for forming a metal gate by metal deposition and CMP back.

U.S. Pat. No. 5,670,401 (Tseng) discloses a poly gate formed by a CMP process.

U.S. Pat. No. 5,395,799 (Yu) shows a poly/WSi$_x$/SiN gate.

SUMMARY OF THE INVENTION

It is an object of the present invention to provide a method for forming a metal gate integrated with a salicide process on the source and drain regions.

It is another object of the present invention to provide a method for forming a transistor gate and metal lines with low contact resistance, requiring reduced source and drain pick up area, and not affected by poly depletion.

It is yet another object of the present invention to provide a method for forming a metal gate with silicide overlying the source and drain regions and metal lines wherein subsequent processing does not require a high thermal budget.

To accomplish the above objectives, the present invention provides a method of forming a metal gate integrated with a salicide process on the source and drain regions.

The process begins by forming a gate dielectric layer and polysilicon/silicon dioxide/silicon nitride dummy gate layers over a substrate structure and patterning them to form a dummy structures. Lightly doped source and drain regions are formed by ion implantation. Spacers are formed on the sidewalls of the dummy gate. Source and drain regions are formed by implanting ions. A silicide layer is formed on the source and drain regions by depositing titanium/titanium nitride, performing a rapid thermal anneal, selectively removing unreacted titanium/titanium nitride using NH$_4$OH$_2$ and performing a second rapid thermal anneal. A blanket dielectric layer is formed over the dummy structures. The blanket dielectric layer, the spacers and the silicon nitride layer of the dummy structures are planarized using a chemical mechanical polishing process. The silicon nitride layer and the silicon dioxide layer of the dummy structures are removed. A titanium nitride layer is formed over the polysilicon layer of the dummy structures, and a tungsten layer is deposited over the titanium nitride layer. The tungsten layer and titanium nitride layer are planarized using a chemical mechanical polishing process, thereby forming polysilicon/titanium nitride/tungsten structures. An inter-layer dielectric layer is formed over the polysilicon/titanium nitride/tungsten structures. A conductive plug is formed in the inter-level dielectric layer over the polysilicon/titanium nitride/tungsten structures. A metal-1 pattern is formed over the conductive plug and the inter-level dielectric and patterned to form device interconnections.

The present invention provides considerable improvement over the prior art. Source and drain regions are formed prior to forming the metal gate, eliminating the need for high temperature processing after metal gate formation which could cause metal migration. The polysilicon/titanium nitride/tungsten gate electrode provides low contact resistance (~1 ohm/sq) while avoiding the poly depletion problem for small scale devices. Also, the integration of the salicide process on the source and drain regions provides low contact resistance at the source and drain, reducing the area required for long distance word line or bit line pick ups in memory circuits.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accor

DETAILED DESCRIPTION OF THE INVENTION

The present invention will be described in detail with reference to the accompanying drawings. The present invention provides a method for forming a polysilicon/titanium silicon/tungsten gate integrated with a salicide process on the source and drain regions.

Figure 1:
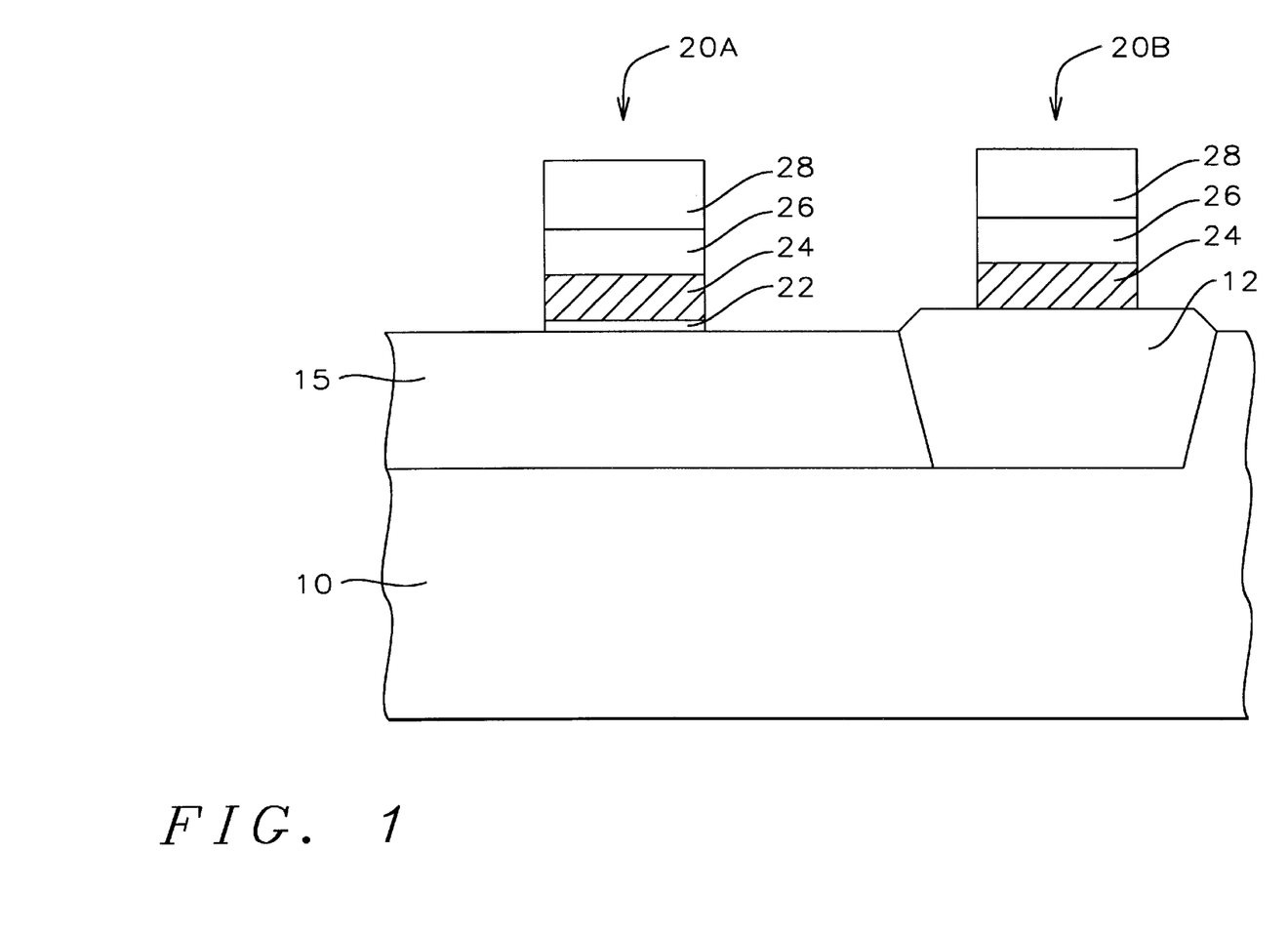
- FIGS. 1 through 6 illustrate sequential sectional views of a process for forming a polysilicon/titanium silicon/tungsten gate integrated with a salicide process on the source and drain regions according to the present invention.

Referring to FIG. 1, the process begins by providing a substrate structure (10) having isolation structures (12) thereon. The substrate structure (10) is preferably a monocrystalline wafer as is known in the art. An isolation structure (12), such as a shallow trench isolation, is formed on the substrate structure (10) to electrically isolate various active regions of the substrate from each other. An active area (15), such as a doped well region, is formed on the substrate adjacent to the isolation region. A gate dielectric layer (22) is formed over the substrate. The gate dielectric layer is preferably a thermally grown gate oxide layer having a thickness of between about 20 Angstroms and 50 Angstroms.

Still referring to FIG. 1, a polysilicon layer (24) is formed over the gate dielectric layer (22) and the isolation structure (12). The polysilicon layer (24) can be formed using chemical vapor deposition, and preferably has a thickness of between about 50 Angstroms and 200 Angstroms. A silicon dioxide layer (26) is formed over the polysilicon layer (24). The silicon dioxide layer (26) preferably has a thickness of between about 100 Angstroms and 300 Angstroms and can be formed using chemical vapor deposition. The silicon dioxide layer (26) acts as a stress relief layer for the subsequently formed silicon nitride layer (28). The silicon dioxide layer (26) also acts as an etch stop during removal of the subsequently formed silicon nitride layer (28).

A silicon nitride layer (28) is formed over the silicon dioxide layer (26). The silicon nitride layer (28) can be formed using chemical vapor deposition and preferably has a thickness of between about 1000 Angstroms and 2000 Angstroms.

Still referring to FIG. 1, the silicon nitride layer (28), the silicon dioxide layer (26), the polysilicon layer (24) and the gate dielectric layer (22) are patterned to define a dummy structures such as a dummy gate electrode (20A) and a dummy line (20B). The dummy structures can be defined using photolithography and an anisotropic etch as are known in the art. The dummy gate electrode (20A) preferably has a width of between about 0.1 microns and 0.2 microns. The dummy line (20B) preferably has a width of between about 0.1 microns and 0.2 microns.

Figure 2:
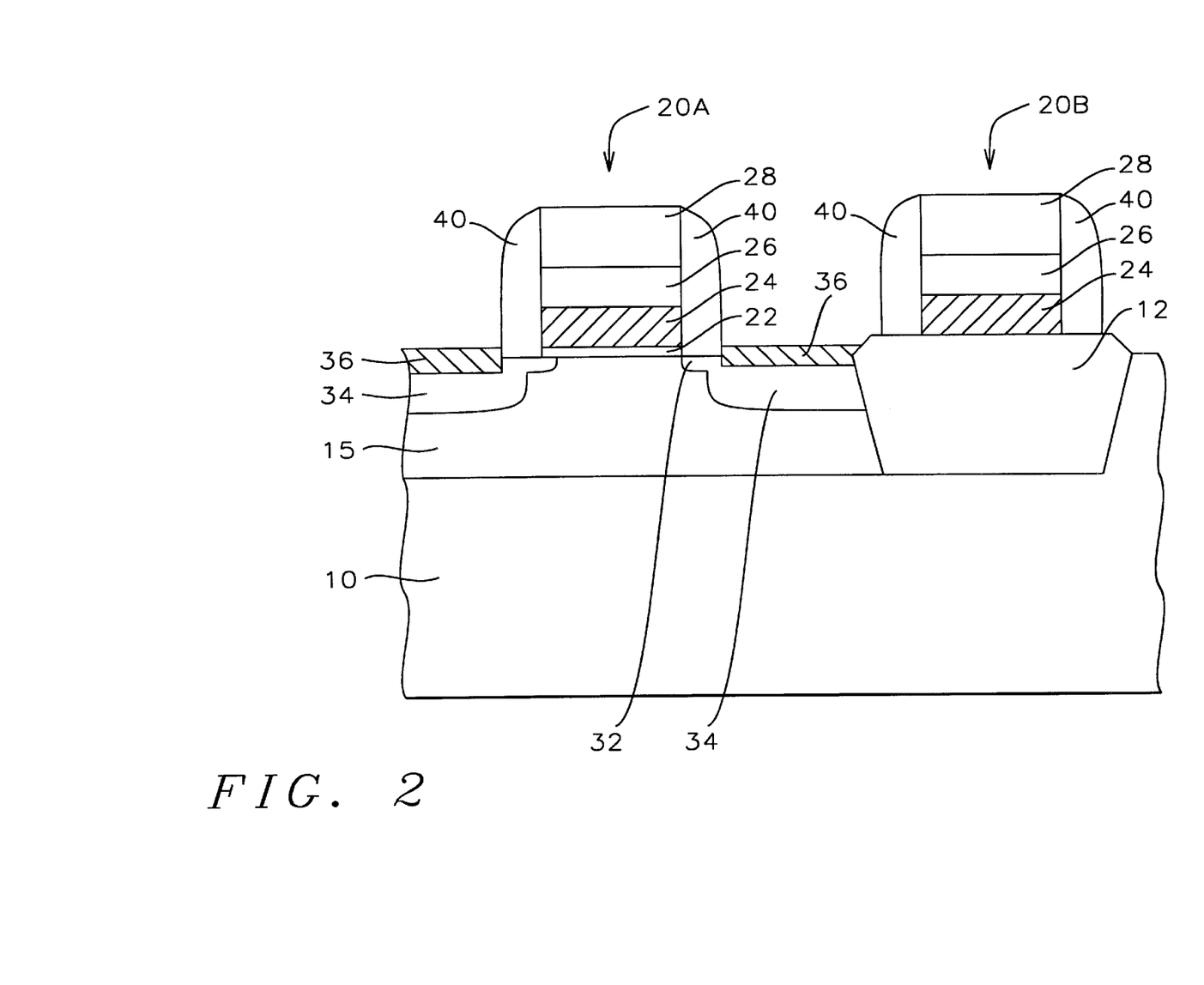

Referring to FIG. 2, impurity ions are implanted into the substrate structure (10) to form lightly doped source and drain regions (32) using the dummy gate electrode (20A) as an implant mask. For an N-type device the implanted ions can be As or $P_{31}$, most preferably As. As ions are preferably implanted at an energy of between about 1 KeV and 30 KeV and at a dose of between about 1E12 atm/cm$^2$ and 1E15 atm/cm$^2$.

Spacers (40) are formed on the sidewalls of the dummy gate electrode (20A). The spacers (40) are preferably composed of silicon dioxide or silicon oxynitride. They can be formed by a blanket deposition and isotropic etch back. The spacers (40) preferably have a thickness of between about 200 Angstroms and 1000 Angstroms.

Still referring to FIG. 2, impurity ions are implanted into the substrate structure (I) to form source and drain regions (34) using the dummy gate electrode (20A) and the spacers (40) as an implant mask. For an N-type device the implanted ions can be As or $P_{31}$, most preferably As. As ions are preferably implanted at an energy of between about 1 KeV and 30 KeV and at a dose of between about 1E15 atm/cm$^2$ and 5E15 atm/cm$^2$. The implanted ionsa are driven-in at a temperature of between about 950° C. and 1150° C. for a time of less than 20 seconds using a rapid thermal anneal process.

Still referring to FIG. 2, a silicide layer (36) is formed on the source and drain regions (34) using a salicide process. A refractory metal layer (not shown), preferably titanium or titanium nitride, is blanket deposited to a thickness of between about 100 Angstroms and 500 Angstroms using a plating process or a sputtering process, most preferably a sputtering process. A rapid thermal anneal process is performed at a temperature of between about 700° C. and 900° C. for a time of between about 10 seconds and 30 seconds. Where the refractory metal overlies silicon, the rapid thermal anneal causes it to react with the silicon to form a silicide layer.

The excess titanium and/or titanium nitride is removed using $NH_4OH$. A key advantage of the present invention is that $NH_4OH$ will remove the excess titanium from the refractory metal layer (not shown) and the titanium nitride formed on the silicon nitride layer (28) without attacking the silicide layer (36) formed on the source and drain regions (34).

A second rapid thermal anneal is performed to lower the sheet resistance of the silicide layer (36). The second rapid thermal anneal process is performed at a temperature of between about 750° C. and 950° C. for a time of between about 10 seconds and 30 seconds.

Figure 3:
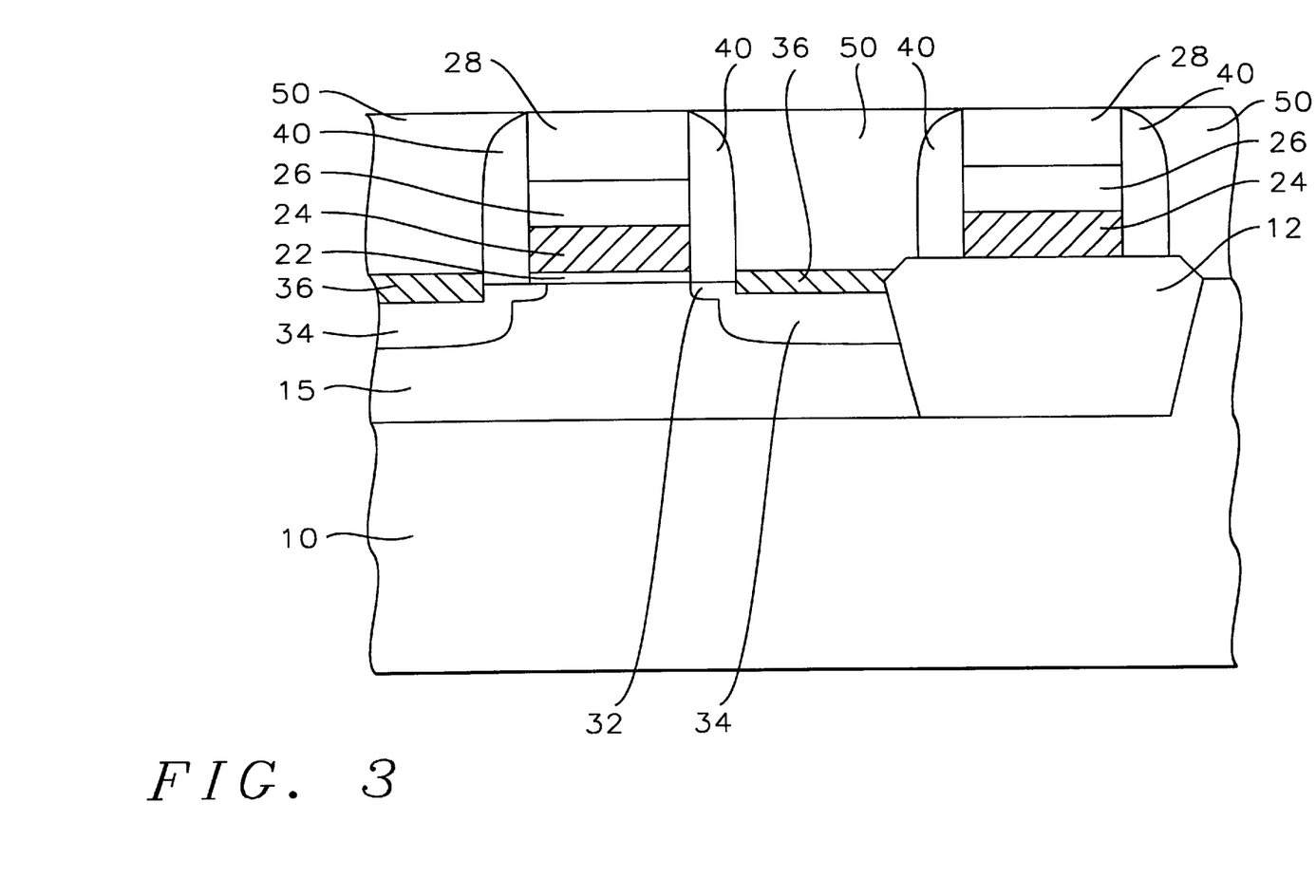

Referring to FIG. 3, a second dielectric layer (50) is formed over the dummy structures (20). The second dielectric layer (50) is preferably composed of silicon dioxide having a thickness of between about 5000 Angstroms and 10000 Angstroms.

Still referring to FIG. 3, the second dielectric layer (50), the spacers (40) and the silicon nitride layer (28) of the dummy structures (20) are planarized using a chemical mechanical polishing process.

Figure 4:
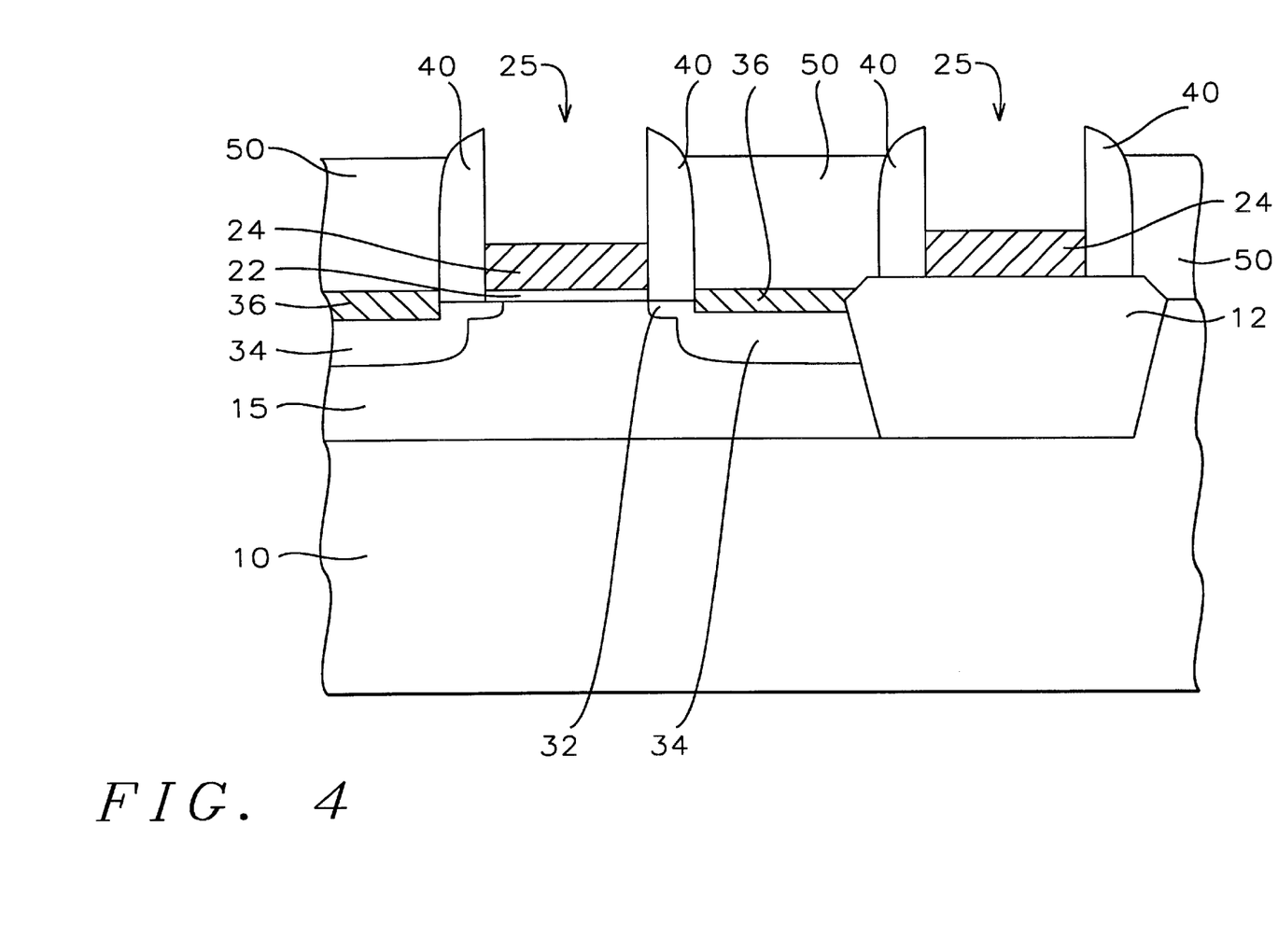

Referring to FIG. 4, the remaining portion of the silicon nitride layer (28) of the dummy structures (20) is selectively removed using a process known in the art, such as wet stripping, with the silicon dioxide layer (26) acting as an etch stop. The silicon dioxide layer (26) of the dummy structures (20) is removed using a process known in the art such as wet stripping. Top openings (25) are formed over the polysilicon layer (24) of the dummy structures (20) and between the spacers (40) by the removal of the silicon nitride layer (28) and the silicon dioxide layer (26).

Figure 5:
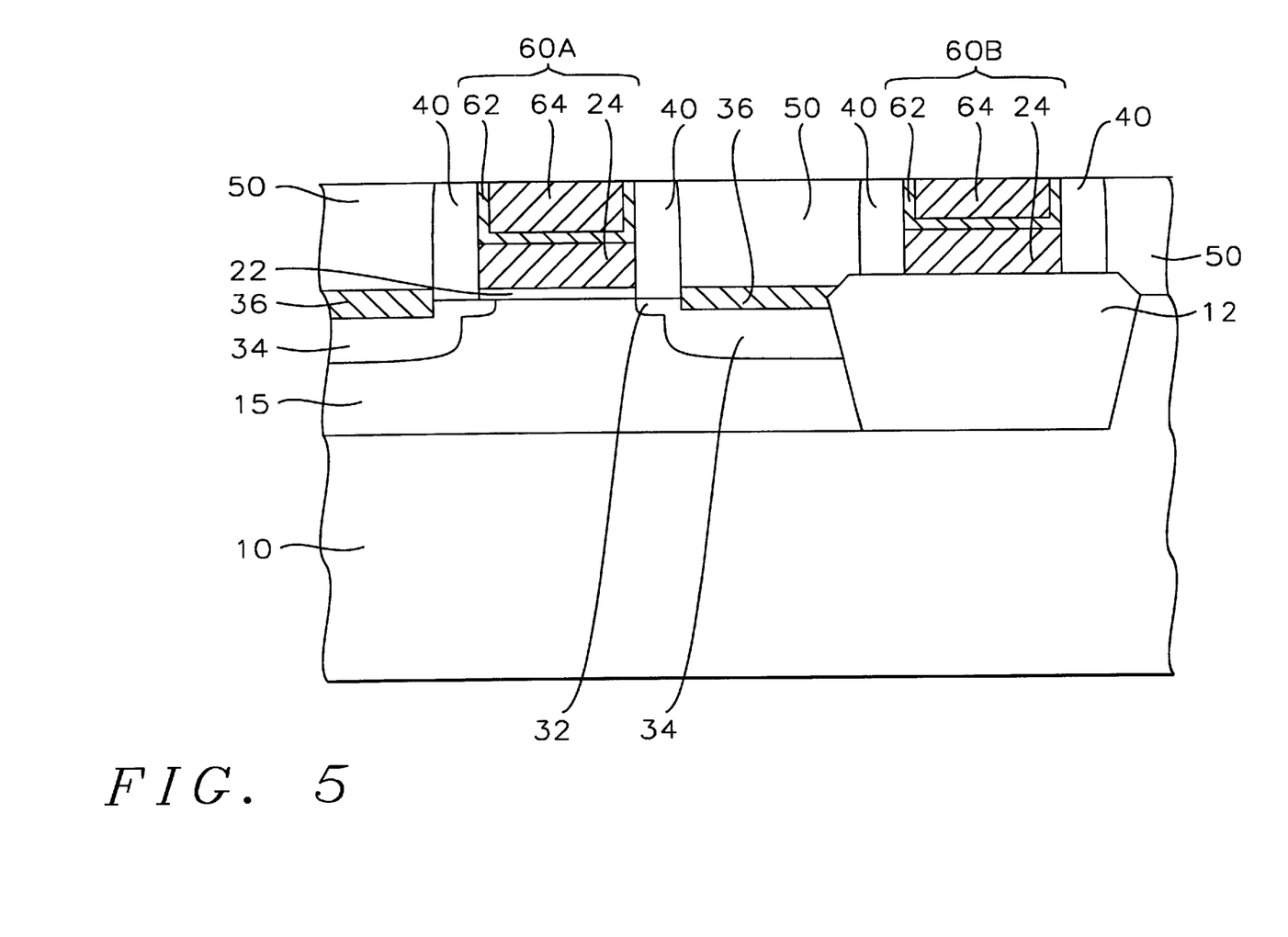

Referring to FIG. 5, a titanium nitride layer (62) is formed over the polysilicon layer (24) of the dummy structures (20). The titanium nitride layer is preferably formed to a thickness of between about 50 Angstroms and 200 Angstroms using a chemical vapor deposition process. Next, a tungsten layer (64) is formed on the titanium nitride layer (62). The tungsten layer is preferably formed to a thickness of between about 1000 Angstroms and 5000 Angstroms using a chemical vapor deposition process.

Still referring to FIG. 5, the tungsten layer (64), the titanium nitride layer (62), and the spacers (40) are planarized using a chemical mechanical polishing process to form polysilicon/titanium nitride/tungsten structures (60). The polysilicon/titanium nitride/tungsten structures (60) preferably comprise a polysilicon/titanium nitride/tungsten gate structure (60A) over the active area (15) and a polysilicon/titanium nitride/tungsten line structure (60B) over the isolation structure (12).

Figure 6:
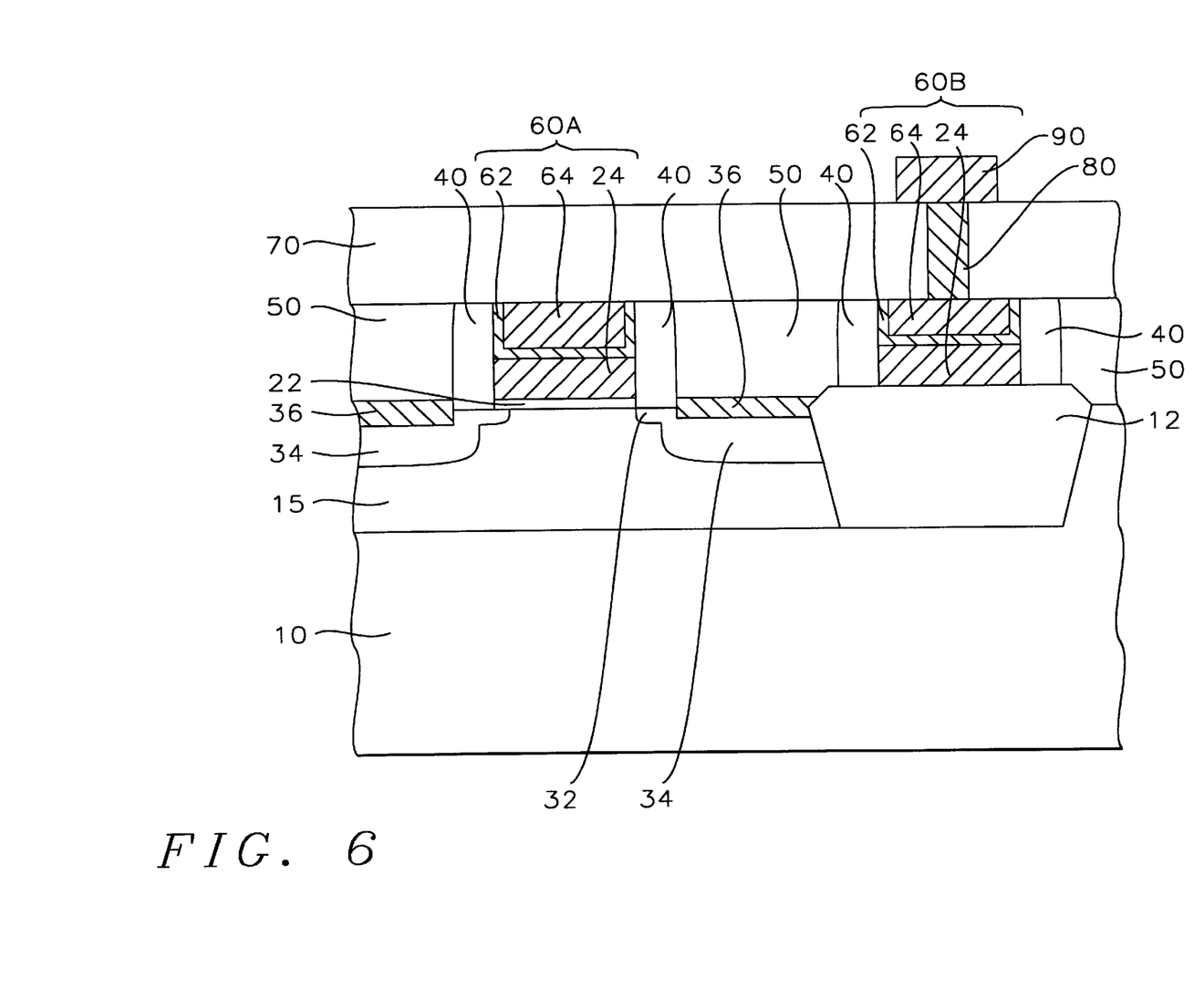

Referring to FIG. 6, a blanket dielectric layer (70) is formed over the polysilicon/titanium nitride/tungsten structures (60). The blanket dielectric layer (70) is preferably composed of silicon dioxide having a thickness of between about 5000 Angstroms and 10000 Angstroms. A contact is formed over the polysilicon/titanium 15 nitride/tungsten structure (60) by patterning the blanket dielectric layer (70) to form contact openings (not shown) and filling the contact openings (not shown) with a conductive plug (80). The conductive plug (80) is preferably composed of tungsten. A first metal layer (90) is formed over the blanket dielectric layer (70) and the conductive plug (80). The first metal layer (90) is then patterned to form device interconnections.

While the invention has been particularly shown and described with reference to the preferred embodiments thereof, it will be understood by those skilled in the art that various changes in form and details may be made without departing from the spirit and scope of the invention. For example, while an N-type gate is described, aP-type gate can be formed using alternate type ion implants.

What is claimed is:

1. A method for forming a polysilicon/titanium silicon/tungsten gate integrated with a salicide process, comprising the steps of:
   a. providing a substrate structure having an isolation structure and an active area thereon;
   b. forming a gate dielectric layer on said substrate structure;
   c. forming dummy structures, with sidewalls, over said active area by sequentially forming a polysilicon layer, a silicon dioxide layer, and a silicon nitride layer then patterning said silicon nitride layer, said silicon dioxide layer, said polysilicon layer, and said gate dielectric layer;
   d. implanting impurity ions into said substrate structure to form lightly doped source and drain regions;
   e. forming silicon oxynitride spacers on said sidewalls of said dummy structures;
   f. implanting impurity ions into said substrate structure to form source and drain regions;
   g. forming a silicide layer on said source and drain regions;
   h. forming a second dielectric layer over said dummy structures;
   i. planarizing said second dielectric layer, spacers and silicon nitride layer of said dummy structures;
   j. removing said silicon nitride layer and said silicon dioxide layer of said dummy structures wherein said nitride and silicon dioxide layers are etched selectively to said oxynitride spacers;
   k. forming a titanium nitride layer over said polysilicon layer of said dummy structure;
   l. forming a tungsten layer on said titanium nitride layer; and
   m. planarizing said tungsten layer, said titanium nitride layer, and said spacers to form polysilicon/titanium nitride/tungsten structures.

2. The method of claim 1 wherein said silicide layer comprises titanium silicide formed by:
   depositing a titanium layer over said source and drain regions;
   performing a first rapid thermal anneal at a temperature of between about 700° C. and 900° C. for a time of between about 10 seconds and 30 seconds;
   removing excess titanium using $NH_4OH$; and
   performing a second rapid thermal anneal at a temperature of between about 750° C. and 950° C. for a time of between about 10 seconds and 30 seconds.

3. The method of claim 1 wherein said polysilicon layer has a thickness of between about 50 Angstroms and 200 Angstroms, said silicon dioxide layer of said dummy structures has a thickness of between about 100 Angstroms and 300 Angstroms, and said silicon nitride layer of said dummy structures has a thickness of between about 1000 Angstroms and 2000 Angstroms.

4. The method of claim 1 wherein said titanium nitride layer has a thickness of between about 100 Angstroms and 200 Angstroms, and said tungsten layer has a thickness of between about 1000 Angstroms and 5000 Angstroms.

5. The method of claim 3 wherein said titanium nitride layer has a thickness of between about 100 Angstroms and 200 Angstroms, and said tungsten layer has a thickness of between about 1000 Angstroms and 5000 Angstroms.

6. The method of claim 1 wherein said polysilicon/titanium nitride/tungsten structures comprise a polysilicon/titanium nitride/tungsten gate structure formed over said active area.

7. The method of claim 6 which further includes a polysilicon/titanium nitride/tungsten line structure formed over said isolation structure.

8. The method of claim 1 which further includes, following step m:
   n. forming an inter level dielectric layer over said polysilicon/titanium nitride/tungsten structures;
   o. forming a conductive plug in said inter level dielectric layer over said polysilicon/titanium nitride/tungsten structures;
   p. forming a metal-1 layer over said inter level dielectric layer and said conductive
   q. patterning said metal-1 layer to form device interconnections.

9. A method for forming a polysilicon/titanium silicon/tungsten gate integrated with a salicide process, comprising the steps of:
   a. providing a substrate structure having an isolation structure thereon and having an active area formed in said substrate structure adjacent to said isolation structure;
   b. forming a gate dielectric layer on said substrate structure;
   c. forming dummy structures, with sidewalls, over said active area by sequentially forming a polysilicon layer, a silicon dioxide layer and a silicon nitride layer then patterning said silicon nitride layer, said silicon dioxide layer, said polysilicon layer, and said gate dielectric layer;
   d. implanting impurity ions into said substrate structure to form lightly doped source and drain regions;
   e. forming silicon oxynitride spacers on said sidewalls of said dummy structures;

f. implanting impurity ions into said substrate structure to form source and drain regions;

g. forming a silicide layer on said source and drain regions;

h. forming a second dielectric layer over said dummy structures;

i. planarizing said second dielectric layer, spacers and silicon nitride layer of said dummy structures;

j. removing said silicon nitride layer selectively to said silicon oxide layer with an $H_3PO_4$ wet etch; then removing said silicon dioxide layer thereby forming a top opening over said polysilicon layer of the dummy structure and between said silicon oxynitride spacers wherein said nitride and silicon dioxide layers are etched selectively to said oxynitride spacers;

k. forming a titanium nitride layer over said polysilicon layer of said dummy structures;

l. forming a tungsten layer on said titanium nitride layer;

m. planarizing said tungsten layer, said titanium nitride layer, and said spacers to form polysilicon/titanium nitride/tungsten structures;

n. forming an inter level dielectric layer over said polysilicon/titanium nitride/tungsten structures;

o. forming a conductive plug in said inter level dielectric layer over said poly silicon/titanium nitride/tungsten structures;

p. forming a metal-1 layer over said inter level dielectric layer and said conductive plug; and q. patterning said metal-1 layer to form device interconnections.

10. The method of claim 9 wherein said silicide layer comprises titanium silicide formed by:

depositing a titanium layer over said source and drain regions;

performing a first rapid thermal anneal at a temperature of between about 700° C. and 900° C. for a time of between about 10 seconds and 30 seconds;

removing excess titanium using $NH_4OH$; and performing a second rapid thermal anneal at a temperature of between about 750° C. and 950° C. for a time of between about 10 seconds and 30 seconds.

11. The method of claim 9 wherein said polysilicon layer has a thickness of between about 50 Angstroms and 200 Angstroms, said silicon dioxide layer of said dummy structures has a thickness of between about 100 Angstroms and 300 Angstroms, and said silicon nitride layer of said dummy structures has a thickness of between about 1000 Angstroms and 2000 Angstroms.

12. The method of claim 9 wherein said titanium nitride layer has a thickness of between about 100 Angstroms and 500 Angstroms, and said tungsten layer has a thickness of between about 1000 Angstroms and 5000 Angstroms.

13. The method of claim 11 wherein said titanium nitride layer has a thickness of between about 100 Angstroms and 500 Angstroms, and said tungsten layer has a thickness of between about 1000 Angstroms and 5000 Angstroms.

14. The method of claim 13 wherein said polysilicon/titanium nitride/tungsten structures comprise a polysilicon/titanium nitride/tungsten gate structure formed over said active area.

15. The method of claim 14 which further includes a dummy structure formed over said isolation structure.

* * * * *